US008717046B2

(12) United States Patent
Jensen et al.

(10) Patent No.: US 8,717,046 B2
(45) Date of Patent: May 6, 2014

(54) NANOTUBE RESONATOR DEVICES

(75) Inventors: Kenneth J. Jensen, Berkeley, CA (US);
Alexander K. Zettl, Kensington, CA
(US); Jeffrey A. Weldon, Oakland, CA
(US)

(73) Assignee: The Regents of the University of California, Oakland, CA (US)

( * ) Notice: Subject to any disclaimer, the term of this patent is extended or adjusted under 35 U.S.C. 154(b) by 749 days.

(21) Appl. No.: 12/681,760

(22) PCT Filed: Sep. 3, 2008

(86) PCT No.: PCT/US2008/075125
§ 371 (c)(1),
(2), (4) Date: Jul. 13, 2010

(87) PCT Pub. No.: WO2009/048695
PCT Pub. Date: Apr. 16, 2009

(65) Prior Publication Data
US 2010/0271003 A1    Oct. 28, 2010

Related U.S. Application Data

(60) Provisional application No. 61/027,456, filed on Feb. 9, 2008, provisional application No. 60/979,345, filed on Oct. 11, 2007.

(51) Int. Cl.
*G01R 27/04*    (2006.01)
*H03H 9/24*    (2006.01)
(52) U.S. Cl.
USPC ........... 324/708; 333/195; 333/200; 977/949; 324/76.49
(58) Field of Classification Search
USPC ................ 324/76.49, 708; 333/200
See application file for complete search history.

(56) References Cited

U.S. PATENT DOCUMENTS

| 2,474,387 | A | * | 6/1949 | Wallace et al. | ............... 455/147 |
| 6,038,060 | A |   | 3/2000 | Crowley |   |
| 6,528,020 | B1 | * | 3/2003 | Dai et al. | .......... 422/98 |
| 6,803,840 | B2 | * | 10/2004 | Hunt et al. | ............... 333/186 |
| 7,118,881 | B2 |   | 10/2006 | Lee |   |
| 7,157,990 | B1 | * | 1/2007 | Adam et al. | ............... 333/186 |
| 2007/0023621 | A1 |   | 2/2007 | Blick et al. |   |

FOREIGN PATENT DOCUMENTS

GB    WO2004080886    9/2004

OTHER PUBLICATIONS

S.T. Purcell, P. Vincent, C. Journet, and Vu Thien Binh, "Tuning of Nanotube Mechanical Resonances by Electric Field Pulling", Dec. 20, 2002, Physical Review Letters, vol. 89 No. 27, pp. 1-4.*

(Continued)

*Primary Examiner* — Melissa Koval
*Assistant Examiner* — Stephen G Armstrong
(74) *Attorney, Agent, or Firm* — David J. Aston; Peters Verny, LLP

(57) ABSTRACT

A fully-functional radio receiver fabricated from a single nanotube is being disclosed. Simultaneously, a single nanotube can perform the functions of all major components of a radio: antenna, tunable band-pass filter, amplifier, and demodulator. A DC voltage source, as supplied by a battery, can power the radio. Using carrier waves in the commercially relevant 40-400 MHz range and both frequency and amplitude modulation techniques, successful music and voice reception has been demonstrated. Also disclosed are a radio transmitter and a mass sensor using a nanotube resonator device.

6 Claims, 9 Drawing Sheets

(56) References Cited

OTHER PUBLICATIONS

O. Siegmund et. al, "Cross Strip Imaging Anodes for Microchannel Plate Detectors", Jun. 2001, IEEE Trans. On Nuclear Science, vol. 48, No. 3, pp. 430-434.*

Burke et al., Quantitative theory of nanowire and nanotube antenna performance, IEEE Transactions on Nanotechnology, vol. 5, No. 4, 2006, pp. 314-333.

International Search Report and Written Opinion, Application No. PCT/US2008/075125, Issued Jun. 1, 2009.

* cited by examiner

NANOTUBE RESONATOR DEVICES

CROSS REFERENCE TO RELATED APPLICATIONS

This application claims priority to U.S. Provisional Patent Application 60/979,345, filed Oct. 11, 2007, and to U.S. Provisional Patent Application 61/027,456, filed Feb. 9, 2008 hereby incorporated by reference in their entirety and further claims priority to PCT/US2008/075125 having an international filing date of 3 Sep. 2008.

STATEMENT OF GOVERNMENTAL SUPPORT

The invention described and claimed herein was made in part utilizing funds supplied by the U.S. Department of Energy under Contract No. DE-AC02-05CH11231 and by the U.S. National Science Foundation within the Center of Integrated Nanomechanical Systems, Grant No. EEC-0425914. The Government has certain rights in this invention.

BACKGROUND OF THE INVENTION

1. Field of the Invention

This invention relates generally to devices made from linear nanostructures, and, more specifically, to devices based on interactions of mechanically oscillating nanotubes, e.g., a nanotube radio or sensor.

2. Related Art

Radio has had a profound effect on civilization from its early use in critical communications, such as with ships at sea, to its later use during the "golden age" of radio in the 1930's as a mass medium for news and entertainment, and finally to its more recent uses in cellular phones, wireless computer networks, and the global positioning system. Historically, applications of radio have been tightly linked to available technology. Early spark-gap receivers, for example, were capable of receiving only on/off signals such as Morse code. Vacuum tube technology enabled cheap, reliable audio communication. Perhaps most strikingly, the solid-state transistor transformed the radio from a bulky, power-hungry, and stationary unit to a device that could be carried in a shirt-pocket. Indeed, the transistor radio marked the beginning of a general trend of electronics miniaturization for communications and computation that has continued to this day. Further miniaturization, however, is expected to necessitate new architectures employing nanoscale materials, such as nanotubes.

Combining many of the unique electrical and mechanical properties of nanotubes, it is now possible to fabricate a fully functional nanotube resonator device such as a radio receiver from a single nanotube, orders-of-magnitude smaller than previous radios. A nanotube radio may lead to new applications such as smaller, cheaper, and more efficient wireless devices and even radio-controlled devices small enough to travel through one's bloodstream. Resonator devices such as transmitters, antennas, demodulators and chemical sensors are also now possible, as described below.

Specific Patents and Publications

Jensen et al., "Nanotube Radio," *Nano Letters*, 7(11):3508-3511 was published by authors including the present inventors on the web on Oct. 31, 2007.

Jensen et al, "An atomic-resolution nanomechanical mass sensor" *Nature Nanotechnology*, 3 (2008) was published by authors including the present inventors on the web on Jul. 20, 2008.

U.S. Pat. No. 7,157,990 to Adam, et al., issued Jan. 2, 2007, entitled "Radio frequency device and method using a carbon nanotube array," discloses a radio frequency (RF) filter includes a substrate, first and second dielectric layers formed on first and second portions of the substrate, a ground plane formed on a third portion of said substrate, a carbon nanotube array, and first and second electrodes.

BRIEF DESCRIPTION OF THE DRAWINGS

The foregoing aspects and others will be readily appreciated by the skilled artisan from the following description of illustrative embodiments when read in conjunction with the accompanying drawings.

DETAILED DESCRIPTION

Definitions

Figure 1:
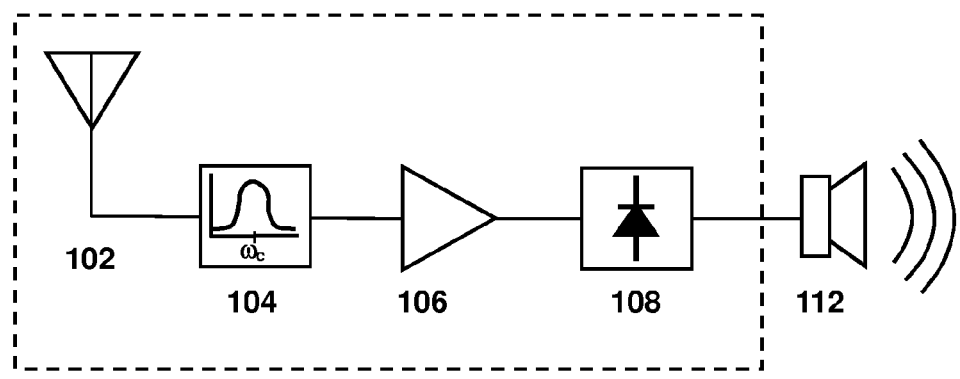
FIG. 1 is a block diagram for a traditional radio showing four major components: antenna, tuner, amplifier, and demodulator.

For the purpose of this disclosure, the term "nanotube" is meant to include any high aspect ratio linear nanostructure, including nanotubes, nanowires and nanoscale beams which can be made to vibrate in an electrical field as taught below. These preferably have a length between 10 microns and 10 nanometers and a diameter or width between 0.5 nm and 1 micron. Examples of the present nanotubes include single-walled and multi-walled nanotubes (e.g., Carbon or boron nitride), metallic (e.g., Ni, Pt, Au) nanowires, semiconducting (e.g., Si, InP, GaN) nanowires, and MEMS or NEMS lithographed nanoscale beams (e.g., Si, SiC) with or without a conducting metallic layer deposited on top. Examples further include linear nanostructures that have round cross sections and cross sections of other shapes, such as ovals, squares, rectangles, triangles, or polygons. The examples are intended to be illustrative and not limiting. The preferred carbon nanotubes have a near perfect carbon tubule structure that resembles a sheet of $sp^2$ bonded carbon atoms rolled into a seamless tube. Nanotubes are generally produced by one of three techniques, namely electric arc discharge, laser ablation and chemical vapor deposition.

For the purpose of this disclosure, the term "electromagnetic signal" is used to mean either electromagnetic waves (e.g., moving through space) or electrons moving through wires or both.

The term "radio" is used to mean the wireless transmission through space of electromagnetic waves in the approximate frequency range from 10 kilohertz to 300,000 megahertz (MHz), particularly 40-400 MHz, and communication of audible signals encoded in electromagnetic waves.

The term "resonator device" refers to the use in the present device of a nanotube which is fixed at one end and is free to vibrate along its length, thus acting as a resonator, due to its nanotube mechanical properties. As described below, it vibrates at a resonant frequency when driven by a DC current and can couple electromagnetic signals with acoustic signals, and responds to an electromagnetic signal moving through the air. It can act as a filter due to the sensitivity of the device to resonance frequency, as well as acting as an antenna to receive electromagnetic signals and an amplifier of those signals.

The term "atoms" is used in its most general sense to refer to atoms, molecules, ions or clusters (preferably less than 10 atoms) or molecules.

Overview

As described below, the present nanotube resonator device provides the functions of all four major radio components, which can, surprisingly, be performed simultaneously using a single nanotube. The major components are an antenna, for picking up electromagnetic signals, which is connected to a tuner, which selects a frequency of interest, an amplifier for boosting the selected signal, a demodulator for removing a carrier signal. The demodulator then may be connected to a speaker for producing audible sound. As a whole, the nanotube radio converts an electromagnetic signal into an electrical signal. The nanotube antenna function involves converting the electromagnetic signal into a mechanical signal. The amplifier/demodulator nanotube function involves converting the mechanical signal into an amplified and demodulated electrical signal.

Described below are embodiments of the present nanotube resonator device in which a nanotube is physically immobilized at one end, while being free to vibrate in space along its length. The nanotube is immobilized at one end and is connected physically to an electrode, and its other end is adjacent an electrode (spaced in close enough proximity to allow an electron field emission current to pass to it) and a field emission current is made to pass from the nanotube tip to the adjacent electrode. This is done preferably in a vacuum or near vacuum, but operation in gases and fluids is also possible. The present device may function, as will be described in detail below, as an antenna, in that it picks up electromagnetic signals from the air (in the approximate frequency range of radio or microwave signals). The antenna may be tuned to a particular frequency and has been shown experimentally to be adjustable between about 100-MHz and 350 MHz, with longer tubes tuned to lower frequencies. This is generally in the rf-VHF range.

The free end of the nanotube in the present device vibrates as a result of a charge on the tip, which is acted upon by the external electromagnetic force. Vibration can be modulated by atomic species attaching to the nanotube, making the device a sensitive sensor. The gap between the nanotube and the electrode can be angstroms to mm and still carry a field emission current. The range for field emission currents is pA to mA. Typically, it will be in the microampere range.

Also described below is a tuner and band pass filter which can be used as part of the present radio device, or in other applications. The tuner, like the antenna is based on the idea that the fixed, stiff nanotube has a particular resonance frequency. In some cases, higher harmonics for the vibrational modes can be used to operate at frequencies higher than the fundamental resonance frequency.

The resonance frequency of a given nanotube in a given device is determined, as described below, by a number of factors, including its length, Young's modulus (stiffness), cross sectional area, and its areal moment of inertia (also known as second moment of inertia, a property of a shape related to its resistance to bending and deflection). These factors may be selected or adjusted for a given, desired resonance frequency.

The nanotube's quality factor (dependent on mass, spring constant, and damping coefficient) determines it bandpass characteristics. The device is described below for use as a bandpass filter, as it can be made to pass only a relatively narrow range of frequencies.

Also described is the use of the resonating, conducting nanotube as an amplifier and demodulator, based on the field emission from the nanotube tip.

These components may be configured in a variety of ways, discussed below. The radio may be a receiver or a transmitter. Also, the nanotube may be altered by contact with small particles (at the atomic scale) on the nanotube, which will change the resonance frequency of the nanotube. This change may be used to detect the impingement of such particles, as well as their mass, providing a mass sensor, on one configuration, and, in another configuration, a device which senses gas particles, when the gaseous atoms (ions) or molecules impinge on the tube, they change the resonance frequency.

Radio (FIGS. 1 and 2)

As shown in the dashed box in the block diagram in FIG. 1, conventional radios consist of four major components: antenna 102, tuner 104, amplifier 106, and demodulator 108. The antenna 102 receives an incoming radio transmission (electromagnetic signal) and converts the transmission into a more useable AC voltage signal. The tuner 104 filters the AC voltage signal, selecting a frequency range or channel of interest. The amplifier 106 boosts the weak radio signal to a higher power level. Finally, the demodulator 108, typically a nonlinear device such as a diode or rectifier, extracts the low frequency AC informational signal from the incoming modulated high frequency AC signal. The AC informational signal can be amplified directly and sent on to another component such as an audio speaker 112.

Figure 2A:
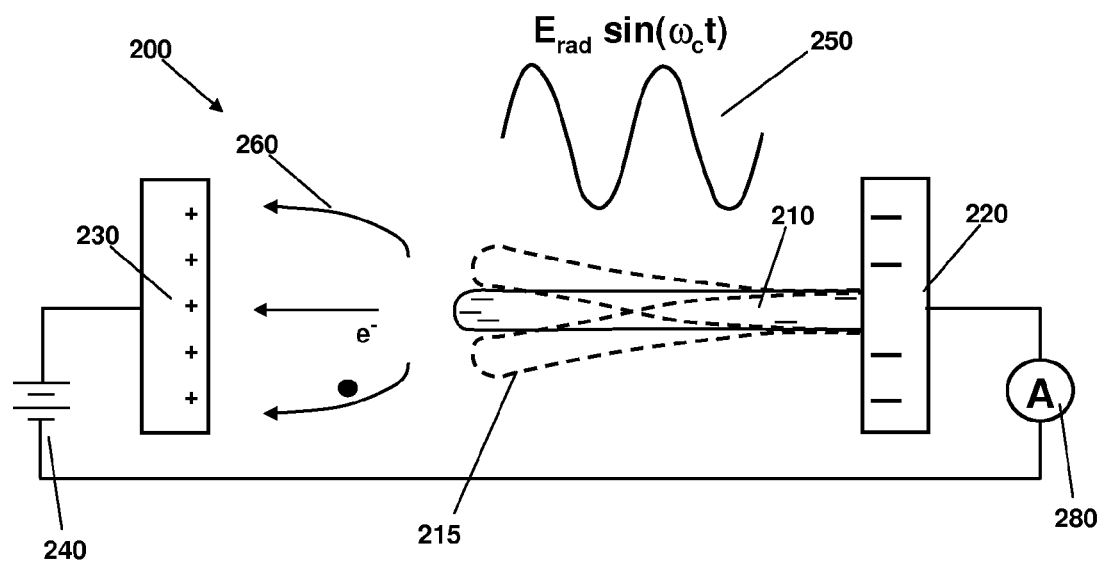
FIG. 2A is a schematic drawing of a nanotube radio, according to an embodiment of the invention. Radio signals tuned to the resonance frequency of the nanotube cause the charged nanotube to vibrate. Electrons emitted from the tip of the nanotube are used to detect the vibrations and also to amplify and demodulate the radio signal.

A schematic of such a nanotube radio 200 is shown in FIG. 2A. A model of simplicity, the entire radio 200 consists of an individual nanotube 210 mounted to an electrode 220, in close proximity to a counter electrode 230. A DC voltage source 240, such as a battery, is connected to the electrodes 220, 230 and powers the radio 200. In some arrangements, a slowly varying AC voltage source 280 can be used instead of the DC voltage source 240. The applied DC bias source 240 charges the tip 215 of the nanotube 210 negatively, sensitizing the tip 215 to oscillating electric fields. Both the electrodes 220, 230 and the nanotube 210 can be contained in vacuum. In one arrangement, the vacuum is below about $10^{-7}$ torr. In another arrangement, a vacuum of about $10^{-5}$ torr can be used. In yet other arrangements, the nanotube radio can be operated at atmospheric pressure.

The nanotube radio 200 operates in a radically different manner than traditional radios. Whereas traditional radios are entirely electrical in nature, the nanotube radio 200 functions mechanically, at least in part. Electromagnetic waves 250 from an incoming radio transmission impinge upon the nanotube 210 forcing it to vibrate physically through the action of the waves 250 on the charged tip 215. The vibrations of the nanotube are significant only when the frequency of the incoming wave 250 coincides with the flexural resonance frequency of the nanotube 210. As described in detail below, the resonance frequency of the nanotube 210 can be tuned during operation. The nanotube radio 200, like any good radio, can be tuned to receive only a pre-selected band of the electromagnetic spectrum. Thus the nanotube 210 can serve the radio 200 as both antenna and tuner.

Amplification and demodulation functions rely on the remarkable field-emission properties of nanotubes, due in large part to their needle-point geometry, which concentrates any electric field applied to the nanotubes. For other linear nanostructures that do not have needle-point geometry, the tips of the nanostructures can be sharpened to improve field emission. Field emission of electrons from the tip of the nanotube is used to detect the vibrations and also amplify and demodulate the signal. Alternatively, for a modified antenna, additional nanostructures that are good field emitters can be incorporated onto the tip(s) of the nanotube(s). A DC bias voltage applied across the electrodes 220, 230 creates such an electric field and causes the nanotube 210 to emit a nominally constant field-emission current 260. In another embodiment of the invention, an additional electrode (not shown) can be positioned near to the nanotube to modify the electric field created by the DC bias voltage. Mechanical vibration of the nanotube 210 modulates the field-emission current 260, which then serves as an easily detected electrical signal. Because the battery voltage 240, rather than the incoming electromagnetic wave 250, powers the field-emission current 260, amplification of the radio signal is possible. Also, due to nonlinearities inherent in field-emission, demodulation of the radio signal occurs as well. As explained below in connection with equation 3, demodulation is a function of squaring the input signal, thereby eliminating the negative component of the applied external field, and elimination of the RF term due to the natural high-pass filtering characteristics of downstream electronics.

Thus, all four major radio components are implemented compactly and efficiently by the nanotube 210 as it both vibrates and emits electrons through field-emission in response to an incoming electromagnetic signal. A current measuring device 280, such a sensitive speaker, can monitor the output of the radio.

Figure 2B:
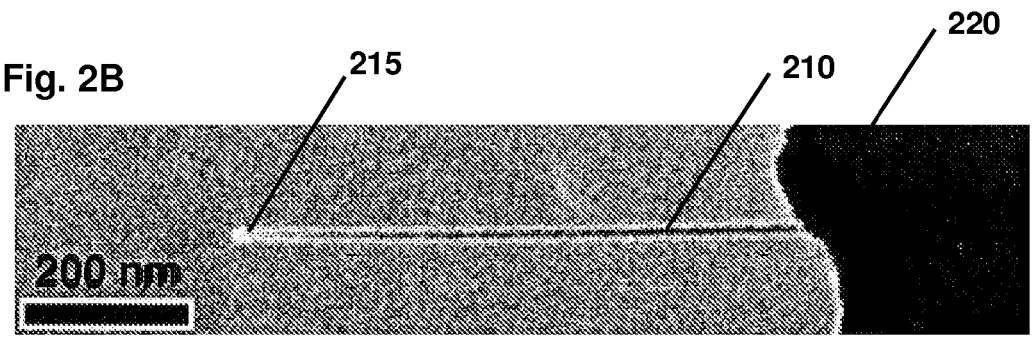
FIG. 2B shows a transmission electron microscope (TEM) image of a nanotube radio before it receives a radio signal. The scale bar shows that the nanotube extends from the electrode approximately 600 nm.
Figure 2C:
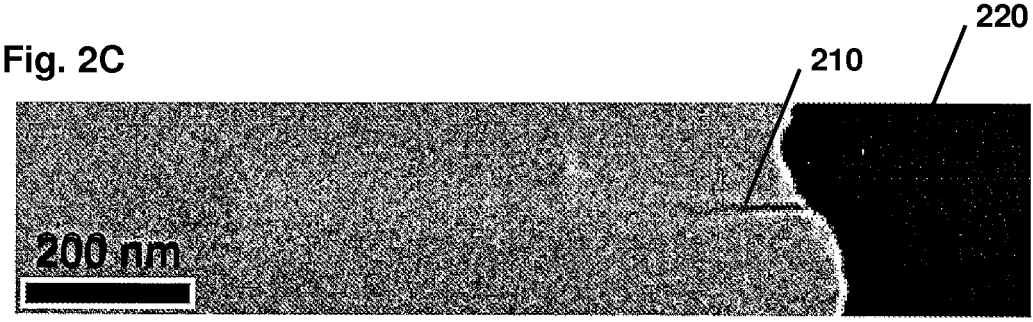
FIG. 2C shows a TEM image of a nanotube radio responding to a resonant radio signal.

In order to confirm the mechanical motion of the nanotube during operation of the radio, a carbon nanotube 210 in a nanotube radio circuit was mounted inside a high resolution transmission electron microscope (TEM). A sine-wave carrier radio signal generated inside the TEM was launched from a nearby transmitting antenna. FIGS. 2B and 2C show TEM micrographs of the same nanotube 210 attached to an electrode 220. In FIG. 2B, the nanotube 210 resonance frequency does not match the transmitted carrier wave frequency. Thus the nanotube 210 is essentially motionless, and no radio reception can occur. Negative charging of the tip 215 of the nanotube 210 manifests itself as brightening in the image.

In FIG. 2C, the carbon nanotube 210 has been adjusted by trimming and tensioning so that its resonance frequency matches the frequency of the transmission carrier wave (251 MHz). Here the oscillating electric field of the radio signal drives the charged nanotube 210 resonantly, causing the nanotube 210 to vibrate vigorously, thereby blurring the image. During the resonance condition, radio reception is possible.

Figure 3A:
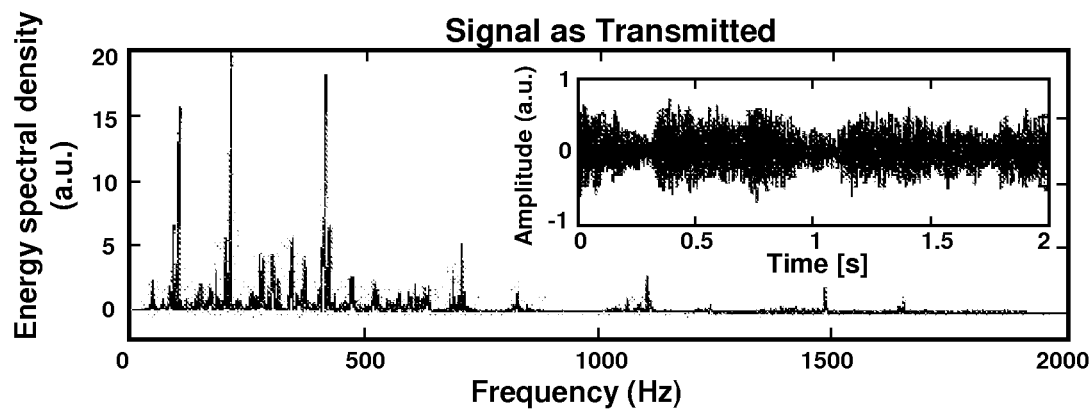
FIG. 3A shows frequency spectra for a radio signal as transmitted.
Figure 3B:
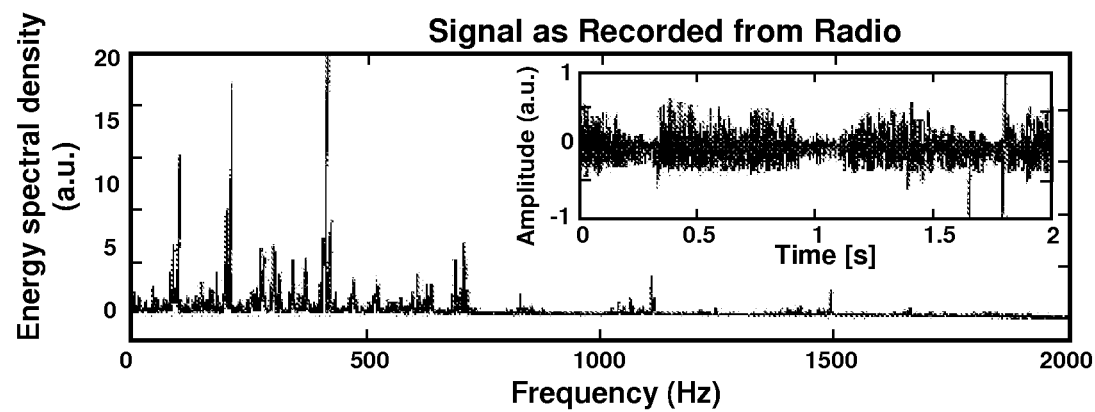
FIG. 3B shows the same signal recorded subsequently after having been received by a nanotube radio for two seconds of the song "Good Vibrations" by the Beach Boys. The insets show the audio waveforms.

To correlate the mechanical motion of the nanotube to actual radio receiver operation, the song Good Vibrations by the Beach Boys was transmitted as a frequency modulated (FM) radio signal. The nanotube radio received, filtered, amplified, and demodulated the transmitted signal. In turn, the signal produced by the radio was amplified further by a current preamplifier, sent to an audio loudspeaker, and recorded. FIG. 3A shows the frequency spectrum and audio waveform of a two second segment of the song (signal) as transmitted. FIG. 3B shows the same segment as recorded from the radio. The nanotube radio faithfully reproduces the audio signal, and the song is easily recognizable by ear. As a test during operation, the nanotube was detuned from the carrier frequency purposely, and, as expected, mechanical resonance was lost as was radio reception. It was straightforward, even without active feedback, to maintain a "lock" on a given radio transmission channel for many minutes at a time. The "locking" feature may result from driving the resonator at large amplitudes and into a non-linear regime, which effectively widens the bandwidth of the band-pass filter section of the nanotube radio.

Tuner and Band-Pass Filter (FIG. 4)

The tuner filters radio signals through the flexural resonance frequency of the nanotube. According to classical Euler-Bernoulli beam theory, the resonance frequency of a cantilevered nanotube is $$f_0 = \frac{0.56}{L^2} \sqrt{\frac{YI}{\rho A}},$$

where L is the length of the nanotube, Y is the Young's modulus, I is the areal moment of inertia ($\pi/4 \cdot (r_o^4 - r_i^4)$ for a cylinder with outer and inner radii $r_o, r_i$), $\rho$ is the density, and A is the cross-sectional area. Typical nanotubes as discussed herein have resonance frequencies in a range from about 10 to 400 MHz, which includes a commercially relevant portion of the electromagnetic spectrum, including FM radio. The bandwidth of the filter is determined by the quality factor, Q, of the nanotube resonator, typically around 500 (see FIG. 4B), through the relationship $$Q = \frac{f_0}{\Delta f}.$$

Figure 4A:
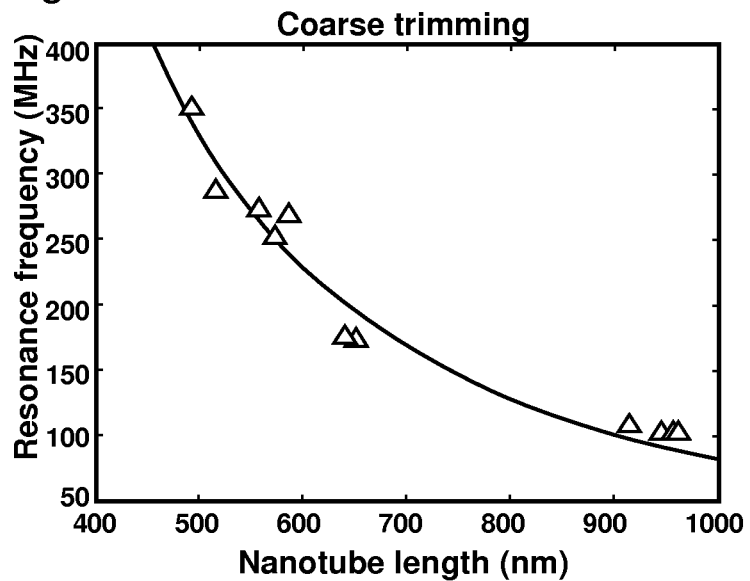
FIG. 4A is a plot of resonant frequency as a function of nanotube length and demonstrates irreversible coarse tuning of a nanotube radio. During coarse tuning, or "trimming," the nanotube is controllably shortened, thus increasing its resonance frequency.

The resonance frequency of the present nanotube radio can be tuned using a two-step process. An initial "coarse" tuning adjustment sets the operational frequency band by trimming, or shortening, the length of the nanotube. In one arrangement, a high field-emission current, much higher than used for radio operation, is run through the nanotube. As a result, atoms are ejected from the end of the nanotube, permanently altering its length. The trimming process, which is irreversible, is terminated once the resonance frequency of the nanotube reaches the target frequency band. FIG. 4A is a plot of resonant frequency as a function of nanotube length and demonstrates coarse tuning of a nanotube radio from a low frequency FM radio band (around 100 MHz) to much higher frequency bands (up to 350 MHz), which are reserved for applications such as television or emergency services.

Figure 4B:
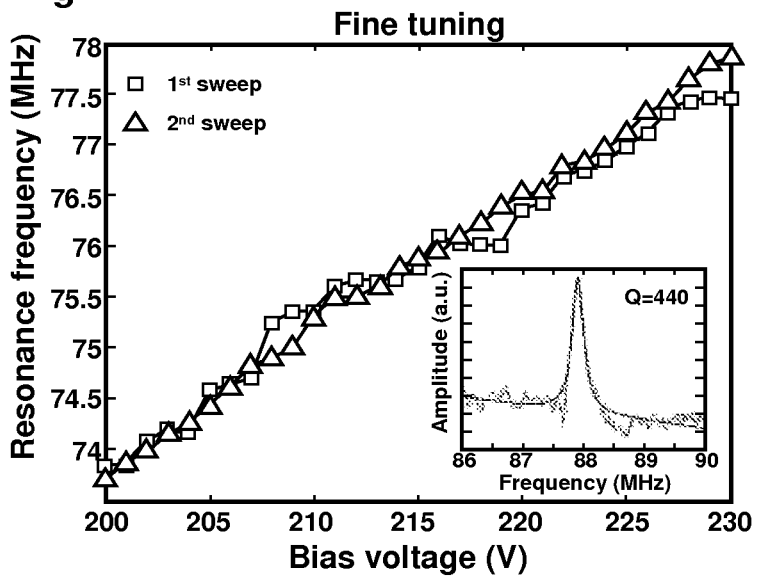
FIG. 4B is a plot of resonant frequency as a function of bias voltage and demonstrates fully reversible fine-tuning of the resonance frequency of a nanotube during radio operation. During fine-tuning, a bias voltage is used to adjust tension on the nanotube. Multiple sweeps of the bias voltage demonstrate the reversibility of the process. Inset is a typical resonance peak with a Lorentzian fit.

Fine-tuning of the radio within the desired band can be accomplished by tensioning the nanotube with an electrostatic field. In one embodiment, the DC bias voltage across the electrode and counter electrode, which effects field emission in the nanotube, can be varied to adjust the tension on the nanotube. A stronger bias voltage results in a higher field emission current and thus higher amplification of the electrical signal. As the bias voltage changes, so does the electric field at the nanotube. It is the electric field strength that affects the tension of the nanotube. The distance between the electrode and the counter electrode can be chosen to optimize both tuning and amplification. As the distance is increased, a desired field strength at the nanotube is achieved through increased bias voltage. In another embodiment, an additional electrode can be positioned near the nanotube to provide a second electrostatic field for just this purpose. The additional electrode can be positioned anywhere adjacent the nanotube as long as the electrostatic field provided by the electrode can influence the tension of the nanotube. Thus, much as a guitar is tuned by tensioning its strings, the resonance frequency of the nanotube can be tuned (over several megahertz) through small adjustments to the (already-established) DC bias voltage. FIG. 4B is a plot of resonant frequency as a function of bias voltage and demonstrates fully reversible fine-tuning of the resonance frequency of a nanotube during radio operation. In tuning the antenna, one makes use of the Euler-Bernoulli bema equation referenced below to calculate the desired length.

This tuning also is applicable to the use of the present device as a band-pass filter, where incoming radio (or other electromagnetic) waves of mixed frequencies are filtered by the nanotube, which picks up only the tuned frequency. The bandwidth picked up is determined by the quality factor of the nanotube, which is set by the surface characteristics of the nanotube, the details of the clamp securing the nanotube to the electrode, and the type and pressure of the gas surrounding the nanotube. As shown in FIG. 4, when further fine tuned by tension, the nanotube can be made to pass a band, for example of only 88±0.5 MHz. The bandwidth of the filter is determined by the quality factor of the nanotube resonator, typically around 500.

Antenna

Antenna function in the present radio is accomplished by the charged tip of the nanotube arranged as shown in FIG. 2. This function may be applied to other types of devices for sensing or transmitting electronic signals. The mode of action of the present antenna is substantially different from other nanotube antennas in which nanotubes are used simply as scaled-down versions of macroscopic antennas. Electromagnetic waves from an incoming radio transmission impinge upon the nanotube forcing it to physically vibrate through their actions on the charged tip. The quantity of charge at the free nanotube tip, when configured as in FIG. 2, has an important effect on the performance of the antenna. In an exemplary embodiment, nanotubes of similar sizes and under similar conditions to the ones discussed herein (L≈500 nm, r≈5 nm, $E_{ext}$≈$10^8$ V/m) can accumulate approximately $3 \times 10^{-17}$ C of charge, which corresponds to almost 200 unbalanced electrons, at their tips.

In one embodiment, an external antenna is used with the nanotube radio to bolster long-range reception. In another embodiment, multiple nanotube radios, all turned to the same frequency can wired together to increase the signal-to-noise ratio of the output signal while preserving the overall small size of the system.

By combining theoretical results for the antenna and tuner, it is possible to determine the sensitivity of the nanotube radio to incoming electromagnetic waves. The amplitude of the vibration of the nanotube tip is given by the equation:

$$|y| = \frac{qE_{rad}/m_{eff}}{\sqrt{(\omega^2 - \omega_0^2)^2 + (\omega\omega_0/Q)^2}} \quad (1)$$

where q is the charge on the tip, $E_{rad}$ is the amplitude of the electric field of the incoming transmission, $m_{eff}$≈0.24 m is the effective mass of the nanotube determined from Euler-Bernoulli theory, and Q is the quality factor. The amplitude may be compared to the thermal vibration of the nanotube, which ultimately limits the sensitivity of the single nanotube radio. The minimum detectable electric field amplitude while maintaining a bandwidth B is $$E_{rad} = \frac{1}{q}\sqrt{4k_B T m_{eff} \omega_0 B/Q},$$

which for the devices described herein is typically 1 V/m/√Hz. The sensitivity of the nanotube radio can be enhanced by operating at reduced temperature, using a lower resonance frequency, or improving the Q of the oscillating nanotube. In one arrangement, Q can be improved through more rigid clamping of the nanotube to the substrate, creating a mismatch between the acoustic impedances of the nanotube and the substrate. In another arrangement, Q can be improved by careful removal of surface contamination from the nanotube. In yet another arrangement, Q can be improved by choosing nanotubes with very good crystallinity. Other well-known techniques for improving Q for non-nanotube resonators can also be used. The present antenna may also be comprised of multiple nanotubes all tuned to the same frequency.

Amplifier and Demodulator

The final two components of the nanotube radio, the amplifier and the demodulator, rely on field-emission from the nanotube tip. The field emission current, I, from a nanotube is well described by the Fowler-Nordheim law:

$$I = c_1 A(\gamma E_{ext})^2 \exp\left(-\frac{c_2}{\gamma E_{ext}}\right) \quad (2)$$

where A is the area from which the nanotube emits, $E_{ext}$ is the external applied electric field, and γ is the local field enhancement factor. The constants $c_1$ and $c_2$ involve only fundamental constants and the work function of the nanotube. For carbon nanotubes $c_1$ and $c_2$ have the values $3.4 \times 10^{-5}$ A/V$^2$ and $7.0 \times 10^{10}$ V/m, respectively. The field enhancement factor, a measure of the concentration of the local electric field by the geometry of the nanotube, distinguishes nanotubes as excellent field emitters and also plays an important role in the operation of the nanotube radio. That is, as stated above, the nanotubes have a needle point geometry, which concentrates the electric field. The DC bias voltage applied across the electrodes produces a nominally constant field-emission current. The input electrical signal (electromagnetic waves, 550 in FIG. 5, at the resonance frequency) to be amplified is used to cause mechanical vibrations of the nanotube. These mechanical vibrations modulate the field-emission current, which then serves as the output signal. Because the battery voltage source, rather than the incoming electric signal, powers the field-emission current, amplification of the signal is possible.

To a good approximation, the field enhancement factor for a nanotube is $\gamma=3.5+h/r$, where h is the height of the tip of the nanotube above the cathode and r is the radius of the nanotube. Similar formulas apply to non-cylindrical nanoscale-beams. As the nanotube vibrates, the height of its tip oscillates, resulting in a time-varying field enhancement factor: $\gamma(t)=\gamma_0+\Delta\gamma(t)$.

The response of the field emission current to the vibrations is determined by substituting $\gamma_0+\Delta\gamma(t)$ for $\gamma$ in Eq. 2. Expanding to second order in powers of $\Delta\gamma(t)/\gamma_0$ and filtering out the zeroth and first powers of $\Delta\gamma(t)/\gamma_0$, which correspond to DC and RF terms, yields $$\Delta I(t) = I_0(1+\alpha+\alpha^2/2)\cdot(\Delta\gamma(t)/\gamma_0)^2; \alpha = \frac{c_2}{\gamma_0 E_{ext}} \quad (3)$$

which accounts for both amplification and demodulation. Amplification occurs because the output of the radio, $\Delta I(t)$, is proportional to the field emission current, $I_0$, which is powered by the battery voltage source. Demodulation, discussed below, occurs because $\Delta I(t)$ is proportional to the square of the input signal $\Delta\gamma(t)$, effectively mixing the input signal with itself. In this manner, a field-emitting nanotube operates similarly to standard diode detectors, i.e., eliminating the negative voltage component.

The demodulator is similar in its construction and operation. The input electrical signal (electromagnetic waves, 550 in FIG. 5, at the resonance frequency) to be demodulated is used to cause mechanical vibrations of the nanotube. As explained above, the incoming signal, which, like a standard radio signal, will have a positive and negative voltage, and an RF carrier component, is converted by the field emission current into a signal in the desired frequency range.

Figure 5:
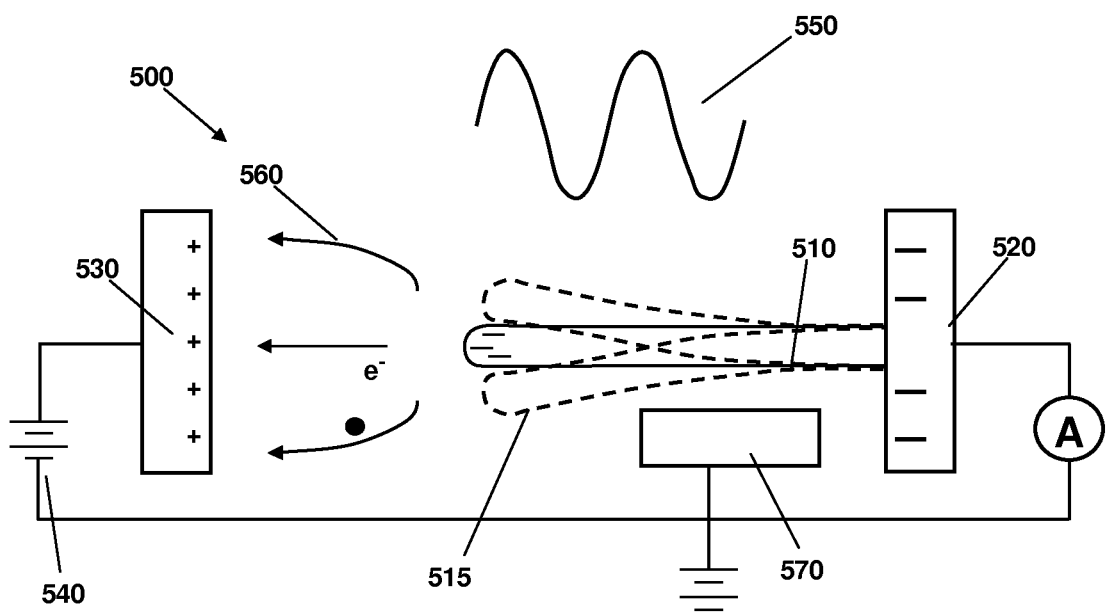
FIG. 5 is a schematic drawing of a nanotube radio transmitter, according to an embodiment of the invention.

Radio Transmitter (FIG. 5)

In another embodiment of the invention a nanoscale device is a high efficiency, nanoscale NEMS radio transmitter or nanomechanical resonator, orders of magnitude smaller than traditional transmitters. Whereas traditional transmitters used dipole antennae to transmit signals which are typically based on some relatively large fraction of the transmitted wavelength, this new type of transmitter allows for the transmission of information from devices that are orders of magnitude smaller than what is available today, thereby allowing for placement of transmitters in places where it was not previously possible. The nanoscale transmitter also uses much less power than traditional transmitters. Nanomechanical resonators have a fundamental flexural resonance mode with a frequency in the megahertz or gigahertz range.

The structure of the nanoscale transmitter, as shown in FIG. 5 is essentially the same as that described for the radio in FIG. 2A. The entire transmitter 500 consists of an individual nanotube 510 mounted to a negative electrode 520, in close proximity to a positive counter electrode 530. An amperage source indicated by a circled "A" provides a current for the field effect emission described below. A DC voltage source 540, such as a battery, is connected to the electrodes 520, 530 and powers the transmitter 500. In some arrangements, a slowly varying AC voltage source can be used instead of the DC voltage source 540. The applied DC bias from voltage source 540 concentrates electrons at the tip 515 of the resonator and causes the nanotube 510 to vibrate at the resonant frequency. It should be noted that the operation of the radio transmitter is different from the radio receiver in this respect. In the receiver, the bias voltage does not result in tip vibration. Here one adjusts the orientation of the electrodes in subtle ways so that the field emission current can be seen to contribute to forces on the nanotube. There is a bit of positive feedback involved, which can be determined through routine experimentation in the placement of the electrodes and the application of the bias voltage, given the present teachings.

The vibrating charge generates electromagnetic waves 550 at the resonance frequency, which can be modulated to transmit information, such as in the form of a radio frequency signal. The system can be self-exciting for oscillatory modes, for example by incorporating field emission current and having a self-detecting feedback. Both the electrodes 520, 530 and the nanotube 510 can be contained in vacuum. In one arrangement, the vacuum is below about $10^{-7}$ torr. In another arrangement, a vacuum of about $10^{-5}$ torr can be used. In yet other arrangements, the nanotube transmitter 500 can be operated at atmospheric pressure.

In this transmitter, the nanotube 510 is mechanically oscillating at the frequency of the carrier signal used in the radio transmission. By applying a DC voltage through voltage source 540 to the nanotube 510, charge is concentrated at the tip of the nanotube, as shown in FIG. 5 by the minus signs. Therefore, when the nanotube oscillates it radiates an oscillating electric field.

In the transmitter, field emission from the tip of the nanotube, shown as current at 560, can induce self-oscillations in the nanotube. In combination with the excess charge in the tip of the nanotube, these mechanical oscillations effectively transmit a radio signal. A DC voltage is used to for both field emission and an external electrode can be used to modulate the transmitted signal by changing the resonant frequency of the nanotube. An external electrode, as shown at 570, is used to apply a $V_{tension}$, while a $V_{bias}$ is provided by a voltage across electrodes 520 (negative electrode, attached to the nanotube) and 530 (positive electrode).

It is known that self-oscillations can be induced in a single-clamped nanoscale resonator by applying only a DC voltage (A. Ayari et al., Nano Letters, 7, 8, 2252-2257, (2007). These self-oscillations are dependent on field emission from the nanotube to a counter electrode 530. This concept can be applied to the present nanotube transmitter by adjusting $V_{bias}$ to a DC voltage that will cause both field emission and self-oscillations in the nanotube. The nanotube will oscillate at the mechanical resonance frequency.

Further, by changing the tension on the nanotube with an additional (either positive or negative) side electrode or side gate, the nanotube would bend asymmetrically and be under tension and therefore change the resonant frequency. The side electrode may be adjacent to the primary electrode, but axially off set, and may be at the same distance from the nanotube as the primary electrode, or closer or farther than the primary electrode. When using a gating electrode, it may be placed in the general area of the tip of the nanotube, i.e., in the vicinity of current 560 in FIG. 5. The gating electrode acts essentially like a gate in a MOSFET transistor, except that, in a MOSFET, the gate must influence the entire conduction channel, so it must be "parallel" to the channel. Here, the gate need only influence part of the nanotube (to pull on it), preferably at the tip. The gating electrode only needs to be placed near the side of the tube; the precise geometry can be determined by routine experimentation, given the present teachings. The gating electrode may also be used to receive the information signal to modulate the frequency of the self-oscillations.

Mechanically oscillating charge in the tip 515 of the nanotube causes the nanotube to act like a small transmitting antenna. The movement of the electrons 560 creating the electromagnetic field is driven by mechanical motion as opposed to electrical current in a standard antenna.

In this transmitter, the oscillator and the nanotube are actually the same element. Therefore, an amplifier is not necessary to drive the antenna. Although an amplifier is not needed, there are a number of ways to control the radiated power. First, by changing magnitude of the mechanical self-oscillation induced by the $V_{bias}$, the power of the transmitted signal would be altered. Although the exact relationship between magnitude of the self-oscillations and the field emission current is not clear, it is believed that higher current leads to larger oscillations [J. M. Kahn, R. H. Katz, and K. S. J. Pister, Journal of Communications and Networks 2, 188-196 (2000)]. Second, by increasing the charge in the nanotube, the magnitude of the radiated field would also change. Finally, an array of nanotubes could be used to further increase the transmitted power. In addition to controlling the output power, these methods could also be used for amplitude modulation.

A typical volume for the active element (i.e., the nanotube) is only $3.9 \times 10^4$ nm$^3$. This is small enough to travel in the human bloodstream or even fit within a single cell. Thus, a host of new biomedical applications are possible. For example, it may be possible to place radio-controlled medical devices in the bloodstream to perform diagnosis or to control drug delivery. Due to its size, a nanotube transmitter could also be used on a conventional integrated circuit to distribute signals that would otherwise require dedicated wires. Along these lines chip to chip wireless communications could reduce both the size and cost of conventional electronics. Other potential applications for nanoscale radios include "smart dust" [J. M. Kahn, R. H. Katz, and K. S. J. Pister, *Journal of Communications and Networks* 2, 188-196 (2000).], enhanced radio frequency identification (RFID) tags, or simply smaller, cheaper wireless devices such as cellular phones.

Besides its small size, the nanotube radio has numerous other advantages. As it is chemically inert, it can operate in a variety of chemical environments. Also, as it is partially composed of mechanical elements, the nanotube radio is naturally radiation hardened and can operate in the presence of severe ionizing radiation (e.g., in space). Finally, because many nanotube radios, each with a different resonance frequency, can be incorporated on the same chip, it is possible to make extremely broad bandwidth devices.

Figure 6:
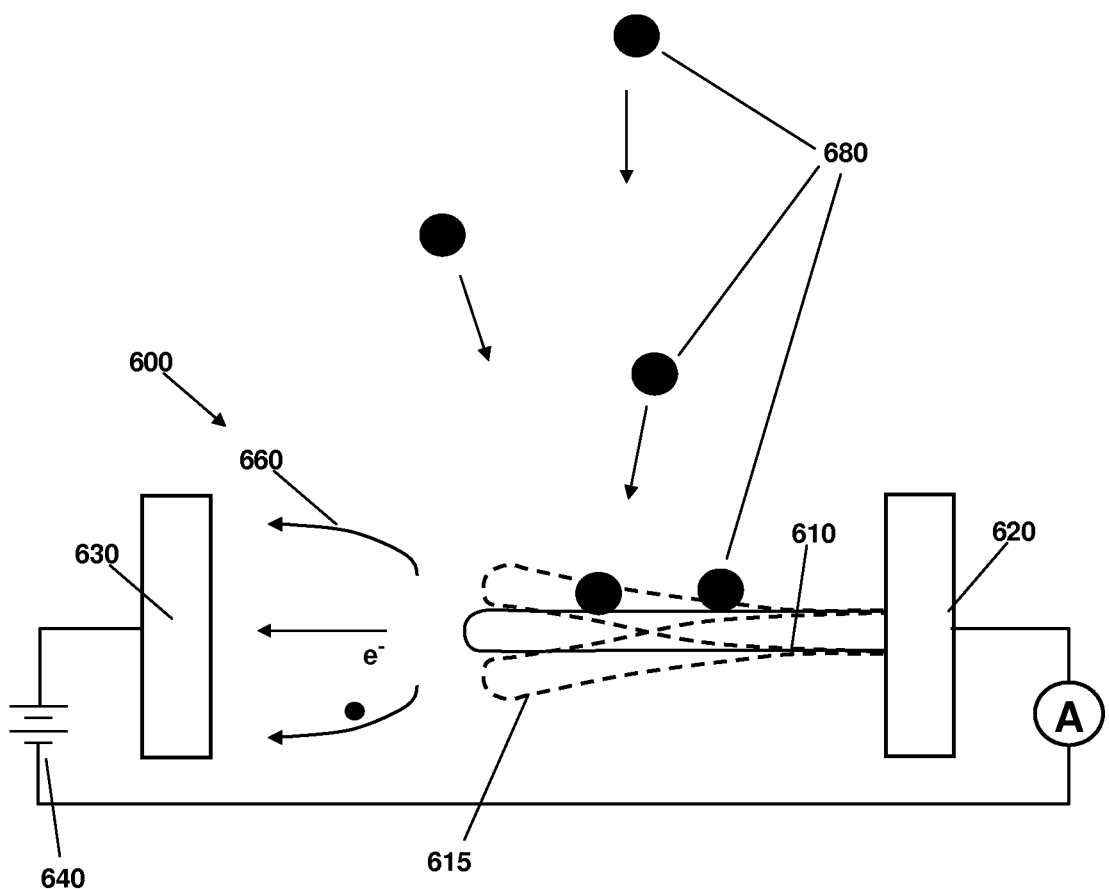
FIG. 6 is a schematic drawing of a nanomechanical-resonator-based mass sensor, according to an embodiment of the invention.

Mass Sensor (FIG. 6)

In another embodiment of the invention, the nanotube resonator is employed in a nanoscale device, which is a new type of mass spectrometer. This device may be cheaper, more sensitive, and have a higher mass range than traditional mass spectrometers. The device provides enough sensitivity to detect the mass of less than a single hydrogen atom.

Traditional mass spectrometers rely on ionizing a particle, accelerating it with a large voltage, and measuring the time-of-flight or the particle's deflection through a large magnetic field. The present nanoscale mass sensor can be better at measuring the masses of large molecules or molecules which are difficult to ionize (e.g., DNA, proteins). Also, it is possible to integrate the nanoscale mass sensor on a chip.

Although the idea of a macroscale resonant mass sensor is known, in practice such sensors are not very sensitive. But by using a single linear nanostructure, such as a carbon nanotube as the resonating element, the mass sensitivity has been increased by orders of magnitude.

The structure of the nanoscale mass sensor, as shown in FIG. 6 is essentially the same as that described for the radio in FIG. 2A. The entire mass sensor 600 consists of an individual nanotube resonator 610 mounted to an electrode 620, in close proximity to a counter electrode 630. A DC voltage source 640, such as a battery, is connected to the electrodes 620, 630 and powers the nanoscale mass sensor 600. In some arrangements, a slowly varying AC voltage source can be used instead of the DC voltage source 640. The applied DC bias from source 640 concentrates electrons at the tip 615 of the resonator and causes the nanotube 610 to vibrate at the resonant frequency, as described above. In general, the nanotube resonator 610 has a fundamental flexural resonance mode with a frequency in the megahertz or even gigahertz range. The resonance frequency is set as described above. As atoms or molecules 680 land on the nanotube 610, the atoms or molecules 680 "mass load" the resonator 610, which results in a shift in the resonance frequency of the resonator 610. The vibrating tip of the nanotube 615 emits charge (through field emission), which, in turn, generates electromagnetic waves (as in the transmitter or receiver) at the resonance frequency of the "mass loaded" nanotube. The "loaded" resonance frequency is different from the resonance frequency of the nanotube 610 before the atoms or molecules 680 are introduced to the system 600. By detecting the frequency shift, it is possible to infer the mass or the atom or molecule 680 that landed on the resonator 610. Even the mass of a single hydrogen atom is detectable with this technique.

The system can be self-exciting for oscillatory modes, for example by incorporating field emission current and having a self-detecting feedback. Both the electrodes 620, 630 and the nanotube 610 can be contained in vacuum. In one arrangement, the vacuum is below about $10^{-7}$ torr. In another arrangement, a vacuum of about $10^{-5}$ torr can be used. In yet other arrangements, the nanotube transmitter 600 can be operated at atmospheric pressure.

This device has been demonstrated as a room temperature, carbon nanotube-based nanomechanical resonator with atomic mass resolution. The device was essentially a mass spectrometer with a mass sensitivity of $1.3 \times 10^{-25}$ kg/vHz, or equivalently, 0.40 gold atoms/vHz. Using this extreme mass sensitivity, atomic mass shot noise was observed, which is analogous to the electronic shot noise measured in many semiconductor experiments. Unlike traditional mass spectrometers, nanomechanical mass spectrometers do not require the potentially destructive ionization of the test sample, are more sensitive to large molecules, and could eventually be incorporated on a chip.

Nanomechanical resonators function as precision mass sensors because their resonant frequency, which is related to their mass, shifts when a particle adsorbs to the resonator and significantly increases the resonator's effective mass. In general, the relation between shifts in resonant frequency and changes in mass depends on the geometry of the resonator and the location of the adsorbed particle. For a cantilevered beam resonator, this relation is described by a responsivity function, R(x), which is defined as the ratio of the shift in resonant frequency, $\Delta f$, to the change in mass, $\Delta m$, as a function of position, x, of the adsorbed mass along the beam. Assuming that the adsorbed mass is distributed evenly along the resonator, this relation can be simplified by averaging over the responsivity function to obtain $$\Delta f = R(x) \cdot \Delta m = -(f_0/2m_0) \cdot \Delta m \qquad \text{Eq. (4)}$$

where $f_0$ is the resonant frequency of the beam and $m_0$ is the initial mass of the beam.

In order to maximize the magnitude of the responsivity, it is apparent from equation (4) that reducing the mass of the resonator, while maintaining high resonance frequencies, is critical. Carbon nanotubes are ideally suited for this task. They are naturally much smaller and less dense than resonators manufactured using standard e-beam lithographic techniques, and thus their mass (~10-21 kg) is typically more than four orders-of-magnitude less than state-of-the-art micromachined resonators (~10-17 kg). Finally, because of their high elastic modulus, even small, slender nanotubes maintain high resonance frequencies.

Another consideration is the geometry of the nanomechanical resonator. Although many previous attempts at precision mass sensing have focused on doubly clamped geometries to allow simple electrical readout, singly clamped geometries have notable advantages. Their dynamic range, essentially how far they can bend before non-linear effects dominate, is significantly increased. Also, singly clamped resonators tend to have higher quality factors (i.e., sharper resonance peaks) due to reduced clamping losses. Our quality factors were typically on the order of 1000.

Both dynamic range and quality factor are important in determining a resonator's ultimate sensitivity.

The presently exemplified device consists of a single arc-grown double-walled nanotube (Hutchison, J. L. et al. Double-walled carbon nanotubes fabricated by a hydrogen arc discharge method. Carbon 39, 761-770 (2001)), about 400 nm long, attached to one electrode in close proximity (for example from 0.1 to several microns) to a counter electrode, as in FIG. 5. We chose double-walled nanotubes over smaller single-walled nanotubes because of their increased rigidity and uniform electrical properties (i.e., mostly metallic). Fabrication of these devices is described in detail in previous work (Jensen, K., Weldon, J., Garcia, H. & Zettl, A. *Nanotube radio*. Nano Lett. 7, 3508-3511 (2007)).

High resolution TEM images enable precision calibration of our devices through determination of their exact size and thus mass. A typical mass was $2.33 \times 10^{-21}$ kg. After calibration by TEM, the nanotube device is transferred to an external measurement apparatus.

The physical layout of the entire nanomechanical mass spectrometer apparatus, including nanotube device and evaporation system, involves a UHV chamber containing the nanotube resonator, a source of atoms, namely an Au evaporator, a shutter between the atom source and the nanoscale resonator, and a quartz crystal microbalance (QCM) also in the path of atoms from the source. The nanotube device was placed at one end of an ultra-high vacuum (UHV) chamber (10-10 torr). To load atoms onto the device, we evaporated gold from a tungsten filament a distance dCNT=50.2 cm away from the nanotube device. A shutter may be inserted between the evaporation source and the nanotube to interrupt the gold mass loading. The water-cooled quartz crystal microbalance (QCM), a distance dQCM=12.8 cm from the evaporation source and normal to the direction of evaporation, is used as a secondary means of calibrating the nanotube device.

One difficulty of using nanomechanical resonators as precision sensors is the detection of the mechanical vibrations of the resonator. In the present device, a detection technique based on a nanotube radio receiver design was used. In effect, one broadcasts a radio signal to the nanotube and listens for its vibrations. This technique relies on the unique field emission properties of carbon nanotubes, one of which is a strong coupling between the field emission current and the nanotube's mechanical vibrations.

Figure 8:
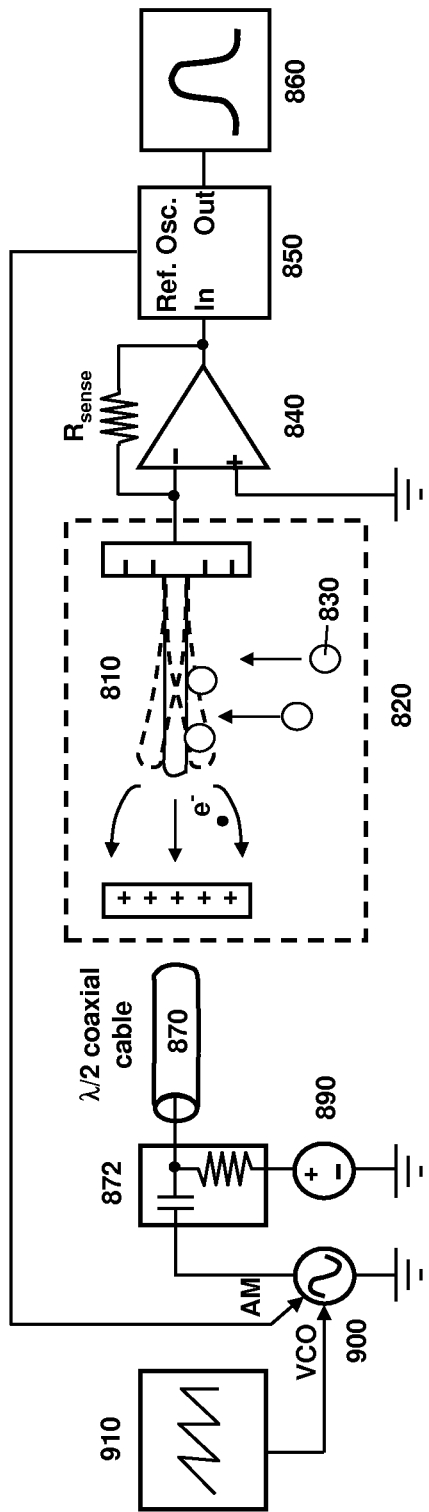
FIG. 8 is a schematic drawing of a mass sensor circuit according to an embodiment of the invention.

FIG. 8 shows a more detailed schematic of the mass sensor. In this design, the negative electrode is connected to a current preamplifier for detecting the field emission current. A lock in amplifier is also connected to the preamplifier output and is used to drive an oscilloscope for measuring changes in frequency as a result of mass change on the nanotube. Suitable drive signals are applied to the nanotube voltage via an RF mixer and a DC bias tee. The present devices use free-standing nanotubes, which are caused to vibrate through a current passed through them. Detection of ambient atoms, molecules, or other particles occurs because additional mass on the vibrating nanotube will alter is resonance frequency by a specific amount related to the mass and number of particles, which become attached to the tube. The present sensor may also take advantage of functionalization whereby chemical groups are introduced onto the surface of the nanotube to make it specifically reactive with certain materials to be sensed. For example, the nanotube could be partially oxidized and used to detect reducing species, or attached to other molecules, whose modification or removal affects resonance. For further details on these modifications, see, e.g., U.S. Pat. No. 7,118,881 to Lee, et al., issued Oct. 10, 2006, entitled "Micro/nano-fabricated glucose sensors using single-walled carbon nanotubes."

A schematic for the electrical detection circuit is shown in FIG. 8. A nanotube 810 deployed in a resonator device as described above (fixed only at one end, extending between electrodes, and receiving a current for a field effect emission) is placed in a UHV chamber 820, Au atoms 830 are contacted with the nanotube 810. The negative electrode (attached to the nanotube 810) is attached to the input of a current preamplifier 840. The output of the current preamplifier 840 is input to a lock-in amplifier 850, which outputs to an oscilloscope 860. The positive electrode of the nanotube resonator is connected by a λ/2 coaxial cable 870 to a high voltage bias tee 872, connected to a DC voltage source 890 as shown. This is connected to an RF signal generator 900, which receives input from a sweep generator 910 and also from lock-in amplifier 850.

Briefly, the electrode opposite the nanotube is biased to induce a field emission current from the nanotube. An amplitude modulated (AM), frequency-swept, via a voltage-controlled oscillator (VCO), RF signal is coupled to the nanotube forcing it into resonance, and consequently modulating the field emission current. The modulated field emission current is recovered by a lock-in amplifier and the resonance peak is displayed on the oscilloscope or recorded by a computer.

In typical operation, experiment, the gold evaporation source's filament current is adjusted, with the shutter closed, until one measures a steady mass flux on the QCM. By opening and closing the shutter multiple times, one loads a small number of gold atoms onto the nanotube each time. As expected, the resonant frequency of the nanotube shifts downward during evaporation and remains steady with the shutter closed. That is, the additional mass of the deposited atoms causes the resonance frequency to be lower, and this frequency shift is measured by the oscilloscope.

The resonant frequency of the nanotube is automatically tracked and recorded at a sampling rate, typically between 10 and 100 Hz.

The QCM provides an alternate method of calibrating the responsivity of the nanotube mass spectrometer, which was initially calculated from TEM-determined parameters. Of course, the QCM does not have the sensitivity to weigh single atoms; however because it averages over a relatively large area, it is an excellent means of measuring mass flux.

Data from such a procedure has shown resonant frequency changing from an initial frequency of about 328.5 MHz to 323 MHz, with a drop in frequency caused by individual Au atoms measurable and quantifiable. The nanotube used in this particular procedure had geometry and mass, determined from TEM images, described by the following parameters: $D_o$=1.78 nm, $D_i$=1.44 nm, L=205 nm, mCNT=1.58×10$^{-21}$ kg. The initial resonant frequency of the nanotube was set near $f_0$=328.5 MHz through electrostatic tensioning. From the resonant frequency and mass of the resonator, we expect a responsivity of 0.104 MHz/zg (1 zg=10$^{-24}$ kg). A scale converting frequency shift to mass using this responsivity was calculated to the right. According to this scale, the frequency shift observed during the first shutter opening corresponds to just 51 gold atoms.

The noise on the plateaus observed by measuring the nanotube resonant frequency, when no atoms are loaded on the nanotube, demonstrates that the sensitivity of this device is 0.13 zg/vHz or equivalently 0.40 Au atoms/vHz. This is the lowest mass noise ever recorded for a nanomechanical resonator, which is even more striking considering that this measurement was performed at room temperature rather than in a cryogenic environment. These noise levels clearly indicate that this device achieved atomic sensitivity. However, to determine the mass of an adsorbed atom, it is also necessary to know, along with the resulting frequency shift, the position of the atom along the nanotube. One method of accomplishing this is to occlude portions of the resonator so that atoms must land at a specific location. Another method, employed here, relies on the statistics of the frequency shifts.

Atoms arrive at the nanotube at a constant average rate. However, because atoms are discrete, the number arriving during any given time interval is governed by Poisson statistics. There are two independent approaches of using Poisson statistics to measure the mass of the gold atoms. The first approach relies on measuring statistical fluctuations in mass adsorption rate, which we term "atomic mass shot noise." The second approach analyzes the statistical distribution of frequency shifts that occur each sampling period.

The statistical distribution of frequency shifts that occur during sampling period, i.e., the period of time when the shutter is open to allow atoms to strike the nanotube. A histogram of frequency shifts showed essentially a Poisson distribution and provides additional evidence of the Poissonian nature of the mass adsorption process and also provides an independent, but related, means of determining the mass of atoms. Assuming a constant evaporation rate, an approximately uniform distribution of atoms along the resonator, and Gaussian noise sources, it is possible to derive the expected distribution of frequency shifts. Due to Poisson statistics, the shape of the expected distribution depends on the number of atoms that adsorb to the resonator per sampling period. Because the mass adsorption rate is well known, the number of atoms per sample depends on the mass of a single atom.

Thus it can be seen that this nanomechanical mass spectrometer has significant advantages over traditional high-resolution mass spectrometers. Most notably, it does not require ionization of the test sample, which makes it more suitable for large biomolecules such as proteins. These molecules are often destroyed during ionization even with "soft" ionization techniques such as matrix-assisted laser desorption/ionization (MALDI) and electrospray ionization. The present device becomes more sensitive at higher mass ranges, in contrast with traditional mass spectrometers. Finally, the device is compact, as it does not require large magnets or long drift tubes, and could in principle be incorporated on a chip.

Figure 7:
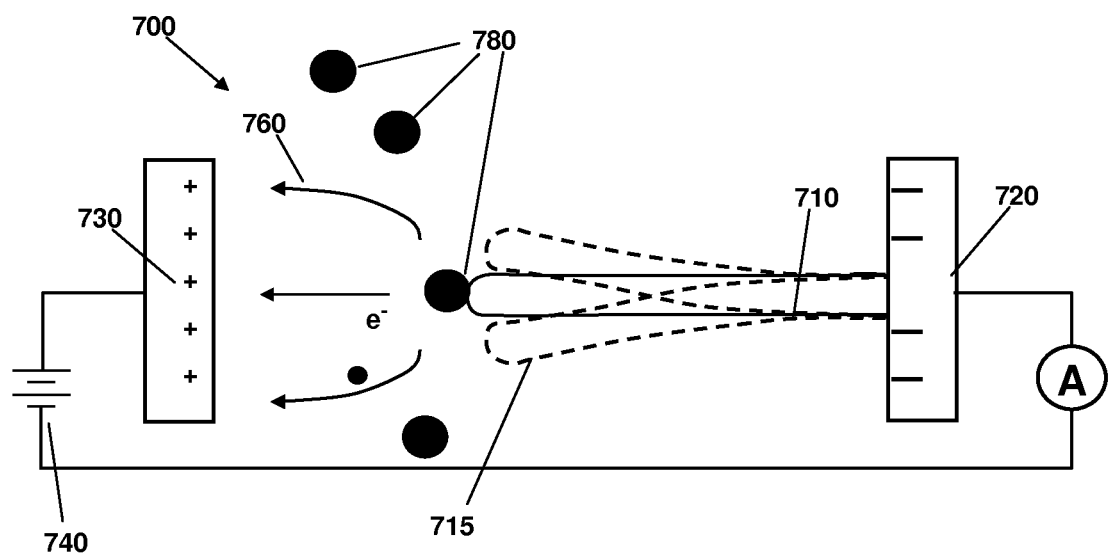
FIG. 7 is a schematic drawing of a nano-mechanical resonator based sensor, according to an embodiment of the invention.

Chemical Sensor (FIG. 7)

In another embodiment of the invention, a nanoscale device is a new type of chemical sensor that is more sensitive and more selective than traditional sensors. The device can sense very low concentrations of many gases, and can distinguish between gases with very high sensitivity and selectivity in a compact, low power, easy read-out nanoscale device. Different gases will cause a different frequency shift due to their mass differences. The device can be coupled to a MEMS-based sensor as is described, e.g., in U.S. Pat. No. 6,667,725 to Simons, et al. issued Dec. 23, 2003, entitled "Radio frequency telemetry system for sensors and actuators." As described there, MEMS pressure sensors can be made which typically measure as little as 0.350 mm in width making them small enough for use in many in-vivo medical applications. With one implanted MEMS pressure sensor according to that patent, it is possible to measure the internal pressure of body organs or wounds. With two MEMS pressure sensors it is possible to measure the pressure drop across an obstruction in an artery or newly implanted heart valve. With three MEMS sensors it is possible to characterize the flow across a long section of arteries, along the esophagus or through the small intestines. This sensor, as well as similarly packaged chemical sensors, can be coupled to a radio transmitter as described here, permitting ex vivo radio monitoring of a MEMS sensor injected into the body, even injected into the blood stream.

Traditional sensors use many different techniques but some of the most sensitive and selective methods use mass spectrometry, a very costly and bulky technology.

The nano-mechanical resonator based sensor is a simple device that uses the resonance frequency of a carbon nanotube coupled with field emission from the tip of the nanotube to identify chemical species. The structure of the nano-mechanical resonator based sensor, as shown in FIG. 7 is the same as that described for the radio in FIG. 2A. The entire sensor 700 consists of an individual nanotube 710 mounted to an electrode 720, in close proximity to a counter electrode 730. A DC voltage source 740, such as a battery, is connected to the electrodes 720, 730 and powers the sensor 700. In some arrangements, a slowly varying AC voltage source can be used instead of the DC voltage source 740. The applied DC bias 740 concentrates electrons at the tip 717 of the nanotube 710 and causes the nanotube 710 to vibrate at the resonant frequency. The nanotube resonator has a fundamental flexural resonance mode with a frequency in the kilohertz to megahertz or even gigahertz range. The applied voltage leads to tunneling of electrons 760 between the nanotube 710 and the counter electrode 730 (either near-field tunneling, or field emission).

Detection of ambient gas particles is accomplished in two ways. First, gas atoms or molecules 780 landing on the nanotube 710 change the vibrating beam mass and hence the resonance frequency. The field emission current 760 can be used to detect this resonance frequency shift accurately. Second, as gas atoms or molecules 780 enter the high field region near the tip of the nanotube, they are drawn to the tip 715 of the nanotube 710. The atoms or molecules 780 may be neutral, polarized, or ionized. When they interact with the nanotube tip 715, they modify the tunneling or field emission current. The magnitude of the current, and/or its spectral density, can be used, along with the change in the resonance frequency, to identify the atomic or molecular species.

Both the electrodes 720, 730 and the nanotube 710 can be contained in vacuum. In one arrangement, the vacuum is below about $10^{-7}$ torr. In another arrangement, a vacuum of about $10^{-5}$ torr can be used. In yet other arrangements, the nanotube transmitter 700 can be operated at atmospheric pressure.

Other Embodiments

In one embodiment of the invention, a nanotube radio is constructed using a bulk method. A macroscopic fiber of carbon nanotubes is attached with conductive epoxy to a conducting wire. In one arrangement, the wire is platinum. The wire, which serves as the cathode, is positioned near an anode plate (e.g., copper plate) using a micromanipulator. In one arrangement, the positioning is done inside a vacuum chamber. Although there are numerous nanotubes in the macroscopic fiber, only the nanotubes that protrude the farthest from the fiber bulk provide significant field emission current during radio operation. Thus, only the nanotubes that protrude the farthest function as nanotube radios. Due to its simplicity, such a bulk construction method can be adapted easily for use with standard lithographic techniques.

Another embodiment of the invention, a more precise single nanotube construction method is used. A nanomanipulation platform (e.g., Nanofactory Instruments AB) can be used to attach a single nanotube to the end of a conductor, such as an etched tungsten tip. The conductor, which serves as a cathode, is positioned near a conducting wire, which serves as an anode.

In yet another embodiment of the invention, a nanotube radio is constructed using standard MEMS techniques. A solid material, such as silicon, is patterned and etched to make a nanoscale beam of material that is cantilevered from a conducting base. The base serves as a cathode. A second conductor positioned near the tip of the nanoscale beam serves as an anode. The patterning and etching process can produce the second conductor also. In another arrangement, the second conductor can be added to the cathode-nanoscale beam assembly made by the MEMS process. Details of fabrication of nanoscale MEMS beams may be found in (WO/2004/080886) MEMS DEVICES ON A NANOMETER SCALE. Although the embodiments of the invention have been discussed in relation to their usefulness with FM (frequency modulation) radio signals, their usefulness with other modulated electromagnetic signals would be readily apparent to one of ordinary skill in the art. Examples include amplitude modulation, single-sideband modulation, phase modulation, quadrature amplitude modulation, orthogonal frequency-division multiplexing, Gaussian minimum-shift keying.

In one embodiment of the invention, a nanoscale device, has a linear nanostructure with a proximal end and a distal end, and an electrode attached to the proximal end. A counter electrode is positioned near to the distal end of the linear nanostructure, and a voltage source is connected to the electrode and the counter electrode, thereby providing a concentration of charge at the distal end of the linear nanostructure. The linear nanostructure is configured to have a resonant frequency coincident with a desired electromagnetic signal frequency. In one arrangement, the device is an antenna. In one arrangement, the device is a tuner. In one arrangement, the device is an amplifier. In one arrangement, the device is a demodulator.

In another embodiment of the invention, a method for converting an electromagnetic signal to an electrical signal involves the steps of providing a linear nanostructure, attaching the proximal end of the linear nanostructure to an electrode, positioning a counter electrode near to the distal end of the linear nanostructure, applying a voltage between the electrode and the counter electrode, thereby enabling a field emission current to flow from the distal end of the linear nanostructure, adapting a linear nanostructure to have a resonant frequency coincident with the frequency of a desired electromagnetic signal, supplying the desired electromagnetic signal, thereby causing the linear nanostructure to vibrate, and collecting the field emission current at the counter electrode while the linear nanostructure vibrates. Thus is the electromagnetic radio transmission converted to an electrical signal. In one arrangement, adapting the linear nanostructure involves shortening the linear nanostructure. In one arrangement, adapting the linear nanostructure involves tensioning the linear nanostructure. Tensioning the linear nanostructure can be done by adjusting the voltage between the electrode and the counter electrode. In another arrangement, a second electrode is provided adjacent the linear nanostructure and adjusting the voltage between the second electrode and the linear nanostructure tensions the linear nanostructure.

In another embodiment of the invention, a method involves providing a linear nanostructure, attaching the proximal end of the linear nanostructure to an electrode, positioning a counter electrode near to the distal end of the linear nanostructure, applying a voltage between the electrode and the counter electrode, and adjusting the voltage until the linear nanostructure begins to vibrate in response to an electromagnetic signal. In one arrangement, the method is used to filter electromagnetic signals. In one arrangement, the method is used to tune a linear nanostructure radio. In one arrangement, the method is used to amplify electromagnetic signals. In one arrangement, the method is used to mix electromagnetic signals. In one arrangement, the method is used to demodulate electromagnetic signals.

In another embodiment of the invention, a method of making a radio involves supplying a linear nanostructure, attaching the proximal end of the linear nanostructure to an electrode, positioning a counter electrode near the distal end of the linear nanostructure, connecting a voltage source to the electrode and the counter electrode, and shortening the linear nanostructure until it has a resonant frequency coincident with the frequency of a desired electromagnetic signal.

Although the embodiments of the invention have been discussed in their usefulness as a radio, other applications would be readily apparent to one of ordinary skill in the art. Examples of other applications include cell phone (radio) receivers and other small wireless devices, radiation-hardened radios, RF (radio frequency) amplifiers, RF mixers, and RF filters.

CONCLUSION

This invention has been described herein in considerable detail to provide those skilled in the art with information relevant to apply the novel principles and to construct and use such specialized components as are required. However, it is to be understood that the invention can be carried out by different equipment, materials and devices, and that various modifications, both as to the equipment and operating procedures, can be accomplished without departing from the scope of the invention itself. All references cited herein are hereby specifically incorporated by reference as is set forth fully in the present specification and serve to further convey to the worker in the field details which are not explained here in the interest of conciseness.

What is claimed is:

1. A method of processing incoming electromagnetic signals having a sine wave carrier signal, comprising:
   (a) providing a single linear nanostructure having a proximal end and a distal end;

(b) attaching the proximal end of the linear nanostructure to a negative electrode;
(c) positioning a counter positive electrode near to the distal end of the linear nanostructure;
(d) applying a voltage between the negative electrode and the positive counter electrode to cause a field emission current flow from the distal end of the linear nanostructure;
(e) adjusting the voltage until the linear nanostructure begins to vibrate in response to an electromagnetic signal; and
(f) filtering the incoming electromagnetic signal to remove the sine wave carrier signal.

2. The method of claim 1 wherein the method tunes a linear nanostructure radio.

3. The method of claim 1 wherein the method amplifies electromagnetic signals.

4. The method of claim 1 wherein the method mixes electromagnetic signals.

5. The method of claim 1 wherein the method demodulates electromagnetic signals.

6. A method of sensing a gas species, comprising:
(a) providing:
   (i) a single linear nanostructure having a proximal end and a distal end;
   (ii) an electrode attached to the proximal end of the linear nanostructure;
   (iii) a counter electrode positioned near to the distal end of the linear nanostructure; and
   (iv) a voltage source connected to the electrode and the counter electrode, thereby providing a concentration of charge at the distal end of the linear nanostructure;
wherein the linear nanostructure is configured to have a resonant frequency coincident with a desired electromagnetic signal frequency;
(b) measuring a first resonance frequency of the linear nanostructure;
(c) measuring a first field emission current between the distal end of the linear nanostructure and the counter electrode;
(d) exposing the linear nanostructure to the gas species;
(e) measuring a second resonance frequency of the linear nanostructure after the exposing step;
(f) measuring a second field emission current between the distal end of the linear nanostructure and the counter electrode;
(g) comparing the first resonance frequency and the second resonance frequency and determining a frequency shift;
(h) comparing the first field emission current and the second field emission current and determining the magnitude of the current change;
(i) inferring the mass of the gas species from the frequency shift; and
(j) identifying the gas species from the mass and the current change.

* * * * *